United States Patent [19]
Principe et al.

[11] Patent Number: 6,110,320
[45] Date of Patent: Aug. 29, 2000

[54] PROCESS FOR COATING A SOLUTION ONTO A SUBSTRATE

[75] Inventors: Frank Santo Principe, Landenberg; Jeffrey Glenn Innocenzo, Towanda, both of Pa.

[73] Assignee: E.I. du Pont de Nemours and Company, Wilmington, Del.

[21] Appl. No.: 09/386,773

[22] Filed: Aug. 31, 1999

Related U.S. Application Data

[63] Continuation-in-part of application No. 09/074,880, May 8, 1998.

[51] Int. Cl.[7] .............................. B32B 31/12; B05C 11/02
[52] U.S. Cl. .................................... 156/273.3; 156/275.5; 156/278; 156/289; 427/355; 118/100; 118/121; 118/407; 430/358
[58] Field of Search .................................. 156/247, 249, 156/273.3, 275.5, 278, 289; 427/355, 359, 365, 371, 384; 430/358; 118/100, 110, 114, 116, 121, 209, 253, 407, 413, 414

[56] References Cited

U.S. PATENT DOCUMENTS

| 2,803,078 | 8/1957 | Coughlin | 118/236 |
| 3,718,117 | 2/1973 | Lewicki, Jr. | 118/414 |
| 4,329,420 | 5/1982 | Bopp | 430/358 |
| 4,523,541 | 6/1985 | Freeman et al. | 118/249 |
| 4,748,066 | 5/1988 | Kelly et al. | 156/210 |
| 4,838,935 | 6/1989 | Karajiannis | 118/236 |
| 4,907,531 | 3/1990 | Houssian | 118/413 |
| 5,490,879 | 2/1996 | Corradi et al. | 118/413 |

FOREIGN PATENT DOCUMENTS

| 57181551 | 11/1982 | Japan . |
| 2 171 338 | 8/1986 | United Kingdom . |

OTHER PUBLICATIONS

Brochure of Suma Apparatebau For Die Grafische Industrie (Max Plank–StraeBe 7, 6074 Rodermark) "Instrustruction Manual For Roller Coater", available by Aug. 5, 1996.
Brochure of "Resource I Automatic Drawdown Machine" (179 Fresh Pond Road, Jamesburg, NJ 08831), available by Aug. 29, 1997.
Brochure of "Central Chemical Service Corp. Opticolor Innovative Product For Custom Graphics" p. 2 (Jun. 1997) (Addison IL).
Brochure of Transcal Corporation (3620 Edison Place, Rolling Meadows, IL) "AP2 High Fidelity Color Proofing System for Adding Spot Colors Including Metallics and Fluorescents to Dupont Waterproof® System" (Revised May, 1995).
Patent Abstracts of Japan, vol. 007, No. 030 (P–173), Feb. 5, 1983 (1983–02–05) & JP 57 181551 A (Toukiyou Process Service KK) Nov. 9, 1982 (1982–11–09).

Primary Examiner—Michael W. Ball
Assistant Examiner—Michael A Tolin

[57] ABSTRACT

The invention relates to an apparatus and a method of using the apparatus for applying a substantially uniform coating of solution onto a substrate. The apparatus includes a substrate support having a compressible surface.

10 Claims, 4 Drawing Sheets

PROCESS FOR COATING A SOLUTION ONTO A SUBSTRATE

RELATED APPLICATION

This is a continuation-in-part of application Ser. No. 09/074,880 filed May 8, 1998.

BACKGROUND OF THE INVENTION

1. Field of the Invention

This invention relates to an apparatus for applying a solution onto a substrate, and more particularly, to an apparatus for coating a layer of an ink solution onto the substrate for use in pre-press proofing.

2. Description of Related Art

Reproduction of color images through printing is an involved process requiring a breakdown of an original image into a number of fundamental single color images and the eventual recombination of the single color images through multiple printings into a full color reproduction of the original.

First color image reproduction typically includes the following steps using filtering and other photographic techniques a number of color separations are produced, typically four. Each separation bearing a halftone dot and/or a continuous tone image corresponding, for instance, magenta, cyan, yellow and black portions of the original. Second, a printing plate is made for each color separation by exposing a sensitized plate through one of the separations and developing the plate. Third, the printing plates are mounted on a multistage printing press which prints inks on a substrate, typically paper, sequentially and in register, one on top of another, four halftone and/or continuous tone images corresponding to each of the color separations to create a full color reproduction of the original.

It is desirable to be able to predict the final image appearance before it is printed, and preferably before making printing plates by reviewing images made directly from the color separations. The art of evaluating the color separations and deciding whether the various colors have indeed been properly separated is called proofing. Proofing is a process which uses the color separations to create a colored image called a proof to visualize what the final printed image will look like typically without actually making printing plates and running the printing press. Proofing through the creation of proofs shows the printer and customer what the job will look like after printing, so changes can be made, if necessary, to the color separations before the job goes to press where it can waste expensive press time, paper and ink if it is not right. Proofs are used for many purposes including for customer approval, for checking compatibility of a number of subjects to be printed on the same plate or job, for internal quality checking and control, and for relatively small numbers of final reproductions.

Although proofs can be made on special proof presses, generally proofs made by photochemical or photomechanical means have been preferred as a less expensive and faster alternative. These proofs are often referred to as offpress prepress or preplate proofs.

Photochemical or photomechanical proofing systems typically use photosensitive elements in making proofs. These systems generally make proofs by exposing photosensitive elements to actinic radiation through one of the image bearing separations to produce a duplicate image. This is either a positive or a negative of the separation depending on the element used. The radiation may make soluble areas insoluble, insoluble areas soluble, tacky areas nontacky, or nontacky areas tacky depending on the element used. After imagewise exposure, the photosensitive element can be developed by washing out soluble areas. Then tacky areas of the element may have to be toned with a dry or liquid colorant. This process is repeated for all color separations. Then the processed elements are laminated together one at a time sometimes on a support or a substrate. Protective layers may be peeled apart and removed from the elements before they are laminated to the support or other image elements. Finally the four color images may be transferred from the support to a receptor, transfer or display sheet such as a sheet of paper, to form the final proof.

There is a need to provide these conventional four color proofs with one or more additional custom colors to closely simulate the desired printed image. Custom colors are often added to printed images for advertising purposes to highlight particular parts of a printed image. However, due to the plethora of possible custom colors, mass production of photosensitive elements with each custom color is not cost effective.

Commercially available devices for coating a solution on a substrate generally includes an assembly having a meyer rod applicator. However, such devices produce a coating layer that is often defective because of non-uniformities such as density variations, streaks and other defects, which are unacceptable for proofing applications. In many cases the coating assembly requires manual operation where an operator positions and holds the meyer rod applicator: thus operator variability often causes the aforementioned defects. In addition, the size of the substrate which can be coated are often limited in many commercially available devices.

SUMMARY OF THE INVENTION

In accordance with this invention there is provided an apparatus for applying a substantially uniform coating of a solution onto a substrate, the apparatus including:

a substrate support for the substrate, the substrate support having a compressible layer at a nip area between a meyer rod and a substrate transport surface, the compressible layer having a compression stiffness (K);

the meyer rod for metering the solution supplied at the nip area on the substrate, the meyer rod having an overall length ($L_{rod}$), a total rod weight value ($W_{rod}$), and a bow measurement (B);

a weight for applying a substantially uniform force onto the meyer rod, the weight having a total weight value ($W_{bar}$);

a substrate transport surface for transporting the substrate through the nip thereby coating a layer of the solution onto the substrate, the layer having a width value (L); and a drying area for drying the layer of solution, such that the apparatus has a Compliant Coating Number ("CCN") of greater than about 1.4, preferably greater than about 2.9, the CCN being defined by formula (1):

$$CCN = \frac{(W_{bar} + W_{rod}) \times (L_{rod})^2}{K \times B \times (L)^3} \qquad (1)$$

In accordance with another aspect of this invention there is provided a process for applying a substantially uniform coating of solution onto a substrate having a first substrate surface and a second substrate surface, the process comprising:

providing a substrate support for the substrate, the substrate support including a compressible surface;

forming a substrate composite including the substrate and the substrate support, wherein the second substrate surface is adjacent to the substrate support;

forming a nip area between a meyer rod and a substrate transport surface;

applying a substantially uniform force onto the meyer rod;

providing a coating solution on at least a portion of the first substrate surface at the nip area;

feeding the substrate composite through the nip area, the meyer rod thereby metering the coating solution over substantially the entire first substrate surface, thereby forming a layer of solution coating;

drying a layer of solution coating in a drying area.

The apparatus and method of the present invention produces a superior coating layer with increased uniformity.

The invention itself, together with further objects and attendant advantages, will best be understood by reference to the following detailed description, taken in conjunction with the accompanying drawings.

BRIEF DESCRIPTION OF THE DRAWINGS

The invention can be more fully understood from the following detailed description thereof in connection with the accompanying drawing described as follows.

DESCRIPTION OF THE PREFERRED EMBODIMENT

Figure 1:
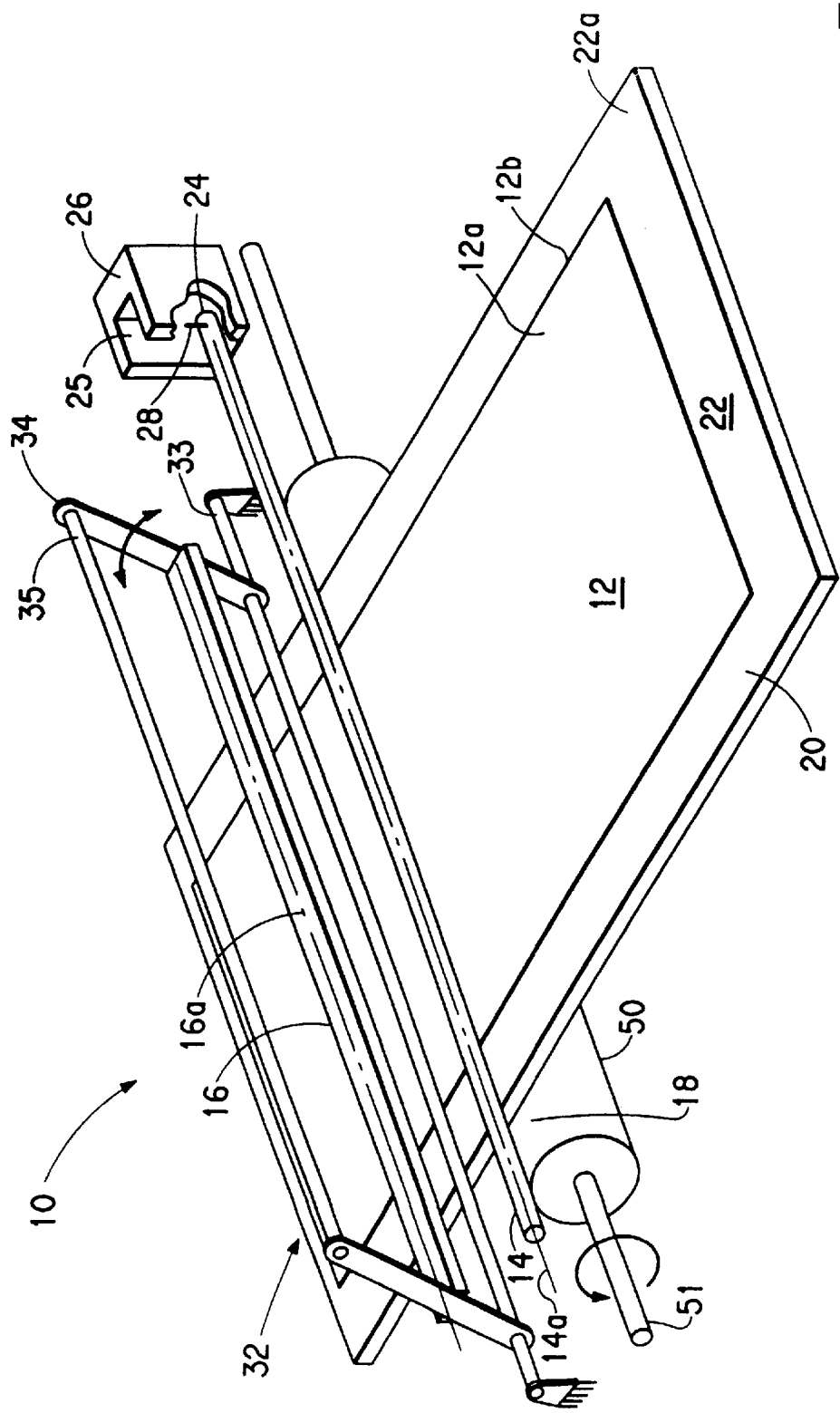
FIG. 1 is a schematic perspective of a first embodiment of an apparatus of the present invention for applying a coating of a solution onto a substrate, showing a substrate support.

Throughout the following detailed description, similar reference characters refer to similar elements in all figures of the drawings.

Figure 2:
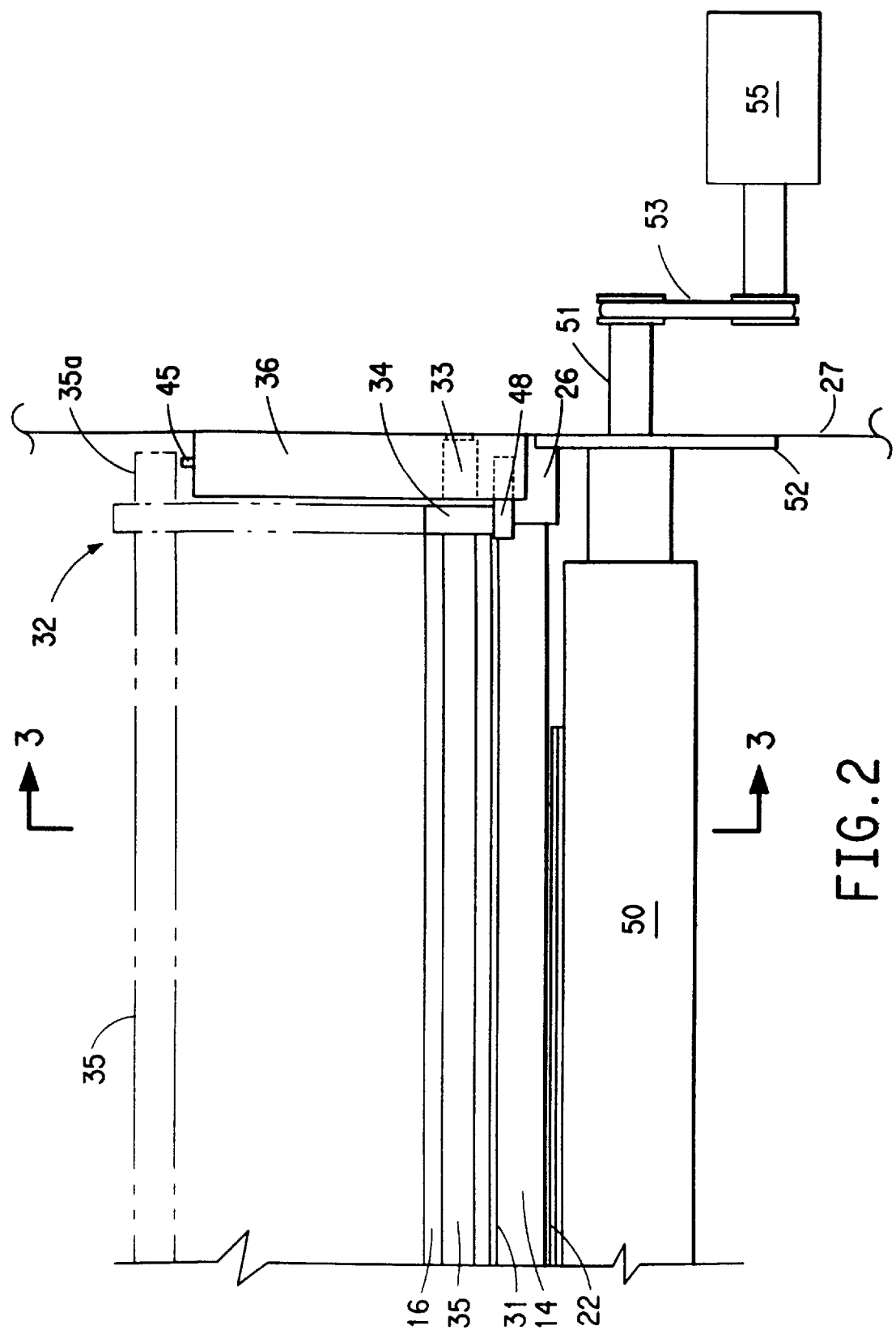
FIG. 2 is a schematic front view of the first embodiment of the apparatus.
Figure 3:
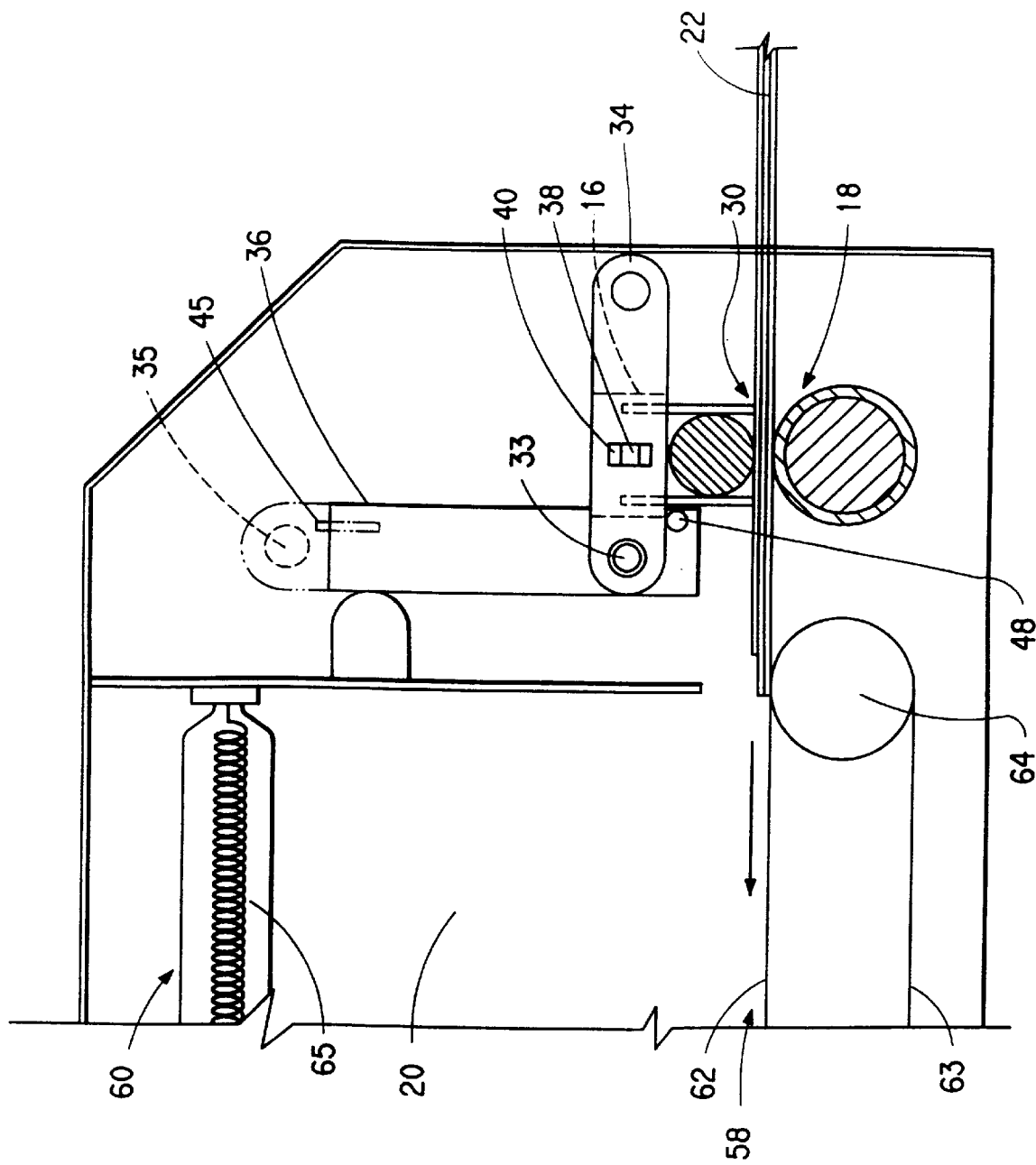
FIG. 3 is a schematic cross-sectional view of the apparatus taken along line 4—4 of FIG. 2.

Referring to FIGS. 1–3, an apparatus 10 for applying a substantially uniform coating of a solution onto a substrate 12 includes a meyer rod 14, a weight 16, a substrate transport surface 18, a drying area 20, and a substrate support 22.

The present invention utilizes a meyer rod 14 to apply the solution to the substrate 12. A wire-wound meyer rod 14 is a stainless steel cylindrical rod with a stainless steel wire wrapped tightly around its circumference across substantially the entire length of the rod. The space between adjacent wires holds the solution. The amount of coating deposit depends on the wire diameter or gauge. The coating is applied to the substrate 12 by using the meyer rod 14 to squeegee off, i.e., meter, an excess of solution to all but the amount between the wires of the meyer rod 14 as the substrate 12 passes by it. The space between the wire curvatures allows a specific amount of the solution to remain and thereby leaves cells of material on the substrate 12. Different wire gauge meyer rods 14 leave a different amount of solution on the substrate 12. Any meyer rod 14 is suitable for use in the present invention. The meyer rod diameter and/or the wire gauge may need to be adjusted in order to attain a desired coating thickness, particularly if the percentage of solids in the solution is changed. In most cases, the preferred meyer rod diameter is between about 0.5 to about 0.75 inches (12.7 to 19 mm).

Since the coating metering is accomplished by the meyer rod 14 in conjunction with machine drive, it is understood that any delivery method can be used to deliver the coating solution to enable the meyer rod 14 to apply the solution to the substrate 12. Thus, suitable delivery methods include those that do not adversely affect the coating quality or the operation of the coating system. By way of example, the delivery method can be a continuous solution delivery during the coating process: a coating solution can be delivered near the nip area 30 from a conduit (not shown) connected to a reservoir (not shown) containing the coating solution. Alternatively, the solution delivery could be intermittently (at least once during, but not continuously thoughout) the coating process. As an illustration, the coating solution can be poured from a reservoir (not shown) either held by a human operator of the coating system or by automated means with the reservoir attached to the coating apparatus. The reservoir can be of any type that enables the solution to be poured, injected, extruded, spread, or in any way distributed at the nip area 30. Examples of such reservoir include, but are not limited to, an open cup, a trough, a plunger syringe or a squeeze bottle.

Preferably, an amount of coating solution is delivered to the nip area to enable the complete coating of a desired area on the substrate 12. Therefore, the amount of coating solution delivered depends at least upon the size of the meyer rod 14 and the size of the area to be coated on the substrate 12.

Each end 24 of the meyer rod 14 resides in an opening 25 in a rod keeper 26 (of which only one is shown in FIG. 1) which is mounted to a side frame 27 of the apparatus 10. Mounted to one end 24 of the meyer rod 14 is a retainer pin 28. The pin 28 is positioned on the end 24 of the meyer rod 14 so that the pin 28 contacts the rod keeper 26 and prevents the meyer rod 14 from rotating during transporting or coating of the substrate 12. A stationary (non-rotating) meyer rod provides a more uniform distribution of the solution coating, reduces the possibility of defects in the meyer rod influencing the coating quality, and is cleaner since the solution does not contact other elements, e.g., weight 16, of apparatus 10.

The weight 16 is placed, for example, on top of the meyer rod 14 to provide a uniform or substantially uniform force on the meyer rod 14 by residing on top of the meyer rod 14. The weight 16 can be of any shape (e.g., circular roller or rectangular bar) and corresponds to the length of the substrate 12 and thereby easily distribute its force on the meyer rod 14. When in position on the meyer rod 14, the weight 16 is aligned parallel with an axis 14a of the meyer rod 14, and preferably the axis 16a of the weight 16 is aligned vertically to the axis 14a of the meyer rod 14. Although the meyer rod 14 itself can apply a force at a nip area 30, generally the weight of the meyer rod 14 alone is not sufficient to provide uniform coating of the solution. The weight 16 applies a substantially uniform force on the meyer rod 14 to bring the meyer rod 14 into substantially uniform contact with the substrate 12 on the substrate support 22. The amount of weight, needed to provide a substantially uniform force on the meyer rod 14 for substantially uniform contact is dependent upon the weight of the meyer rod 14 and the compressibility of the substrate support 22. It is contemplated to be within the skill in the art to replace the weight with other components for applying a substantially uniform force on the meyer rod 14, such as for example, spring components, or electromechanical, pneumatic or magnetic components. The effect of weight 16 may also be provided in other forms, such as providing a magnetic pull (not shown) on the meyer rod 14.

Optionally, the weight 16 includes a cushion (not shown) which contacts the meyer rod 14 and prevents damage that may occur to the meyer rod 14 from contact with the weight 16. The cushion 31 can be made of any material that will protect the meyer rod 14 from damage, such as for example, natural or synthetic rubber.

A weight assembly 32 can be used to place the weight 16 onto the meyer rod 14. The weight assembly includes a pivot shaft 33 (as best seen in FIGS. 2 and 3), two arm members 34, the weight 16, and a handle 35. The pivot shaft 33 is secured to a block 36 mounted to each side frame 27. Each arm member 34 is coupled to pivot shaft 33. The handle 35 is mounted between the two arm members 34. Each end of the weight 16 has a finger 38 which extends and engages with a slot 40 in each of the arm members 34 to mount the weight 16 to the assembly 32. Each slot 40 is larger than the finger 38 and is oriented so that finger 38 can move vertically in the slot 40 without rotation when the weight 16 is in position on the meyer rod 14. The weight 16 can thus float on the meyer rod 14 during coating and also accommodate different meyer rods of different diameters. Referring to FIG. 3, the arm members 34 and the handle 35 of the weight assembly 32 are shown in phantom lines in a first position in which the weight 16 is not on the meyer rod 14, and are shown in a second position in which the weight 16 is on the meyer rod 14. A moveable retaining pin 45, such as a spring-loaded detent or spring plunger, is mounted on top of each of the blocks 36. Each end 35a of the handle 35 extends past the arm member 34 so that the handle end 35a rests behind the retaining pin 45 to keep the weight 16 off of the meyer rod 14 in the first position of the weight assembly 32. Also suitable for use as the retaining pin 45 is a latch or clamp which can hold the weight assembly 32 in the first position and which can be released to allow the weight assembly 32 to move to the second position. The handle 35 is moved forward past the retaining pin 45 and downward rotating the arm members 34 about the pivot shaft 33 about 90 degrees and thereby positioning the weight 16 on the meyer rod 14. A second pin 48 mounted to each of the blocks 36 prevents the weight assembly 32 from over-rotation and maintains position of the weight 16 on the meyer rod 14. The weight assembly 32 simplifies positioning of the weight 16 on the meyer rod 14. Alternatively, the weight 16 can be positioned on the meyer rod 14 mechanically, for example with springs, or pneumatically, electromechanically, or manually. For manual placement of the weight 16, the opening 25 of the rod keeper 26 can be extended (and shaped) to retain the ends of the weight 16 in the rod keeper 26. The weight 16 would be remote from the present apparatus when not in use and would be positioned on the meyer rod 14 by placing ends of the weight 16 into the extended opening 25 of the rod keeper 26.

The substrate transport surface 18 and the meyer rod 14 forms a nip area 30. The substrate transport surface 18 is a means for transporting the substrate 12 through the nip area 30. The substrate transport surface 18 includes a drive roller 50 rotatably mounted to the side frames 27 of the apparatus 10. As is conventional in the art, the drive roller 50 includes a shaft 51, one end of which extends through a bearing 52 and is connected by belt and pulley 53 to a motor 55. The drive roller 50 may have a covering (not shown) that provides a high frictional surface to the substrate transport surface 18 for the substrate support 22.

As best seen in FIG. 3, the drier area 20 includes a surface 58 for holding the substrate 12 and/or substrate support 22, and a heat source 60 to remove excess moisture or volatiles from the coated layer on the substrate 12. The means for holding 58 can be a conveyor 62, or a stationary surface (not shown), such as provided by a plate, a ribbed surface, or a rack. As shown in part in FIG. 3, a conveyor 62 includes a conveyor belt 63 as a continuous loop engaging separated rollers 64 (one of which can be seen), in which one of the rollers 64 is driven by a motor (which can be the same motor 55 used for the substrate transport surface 18). The conveyor 62 transports the substrate 12 on the substrate support 22 through the drier area 20 to an exit. Alternatively, the stationary surface which is supported horizontally between the side frames 27 of the apparatus 10 can be used to support the substrate 12 and substrate support 22 in the drier area 20. Residence time in the drier area of the coated substrate is dependent upon the thickness and composition of the coating layer. If the layer cannot be sufficiently dried during the conveyance time in the drier area 20, the substrate 12 can reside on the stationary surface to allow sufficient time to dry the coated layer. In this case during drying, a trailing end of the substrate support 22 (not including the substrate 12) may remain in contact with the substrate transport surface 18 with the motor 55 off and the weight 16 and meyer rod 14 removed (not shown). After drying is completed, the substrate 12 and the substrate support 22 would be backed out from the drier area 20, by the frictional contact of the substrate support 22 on the substrate transport surface 18 and/or the conveyor belt 63, and reversing the motor 55, or by manual removal. Heating in the drier area 20 can occur by any means suitable to remove the excess moisture or volatiles from the coated solution layer, such as, conduction, convection and radiant heating. Radiant heating with the use of multiple infrared heating lamps 65 is preferred for cleanliness and heating uniformity. Preferably the temperature of the coating surface on the substrate in the drier area 20 is from about 25 to about 100° C., and most preferably from about 35 to about 50° C.

Figure 4:
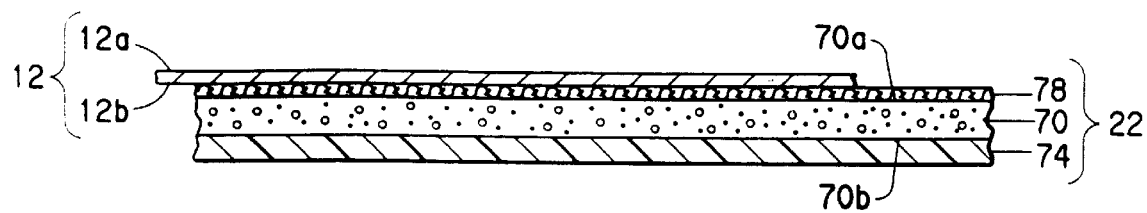
FIG. 4 is a cross-sectional view of an embodiment of the substrate support.

Referring to FIG. 4, the substrate 12 has a first surface 12a and a second surface 12b. The second surface 12b of the substrate 12 is adjacent to a first support surface 22a of the substrate support 22 during application, i.e., coating, of the solution onto the first surface 12a of the substrate 12. Preferably the substrate 12 is in sheet form and is not dispensed from or wound onto or about rollers during application of the solution. Substrates 12 useful in the present invention are not limited. Preferred substrates 12 are photosensitive elements having an entirely aqueous developable photosensitive layer on a removable support as disclosed in U.S. Pat. No. 5,019,471, which is herein incorporated by reference.

The substrate support 22 includes a compressible layer 70. The compressible layer 70 cushions the substrate 12 to the substantially uniform pressure applied to the meyer rod 14 by the weight 16. The compressible layer 70 compensates for variations in substrate thickness, non-uniformities in the meyer rod and substrate transport surface, and non-uniformities in other layers associated with the substrate support. The compressible layer 70 thus maintains substantially uniform contact of substrate 12 with the meyer rod 14 to provide a substantially uniform coating of the solution on the substrate 12 in a coating direction and in a direction transverse to the coating direction. In addition, the compressible layer 70 of the substrate support 22 preferably has sufficient resiliency to rebound repeatedly to the original dimensions so that the material does not retain significant permanent deformations from mishandling or from the coating process itself.

Any material is suitable as the compressible layer 70 provided that the material has the desired compressibility, resilience, and resistance to solvents and chemicals which it might contact in use and to the thermal conditions of the drier area. In the present description, the compressibility may also be identified as the compression stiffness of the compressible layer. Materials suitable for use as the compressible layer 70 include, but are not limited to, synthetic polymeric foams, such as for example, polyurethanes; elastomers and vulcanized rubbers both natural and synthetic, such as for example, isoprene, neoprene, polybutadiene, polyisoprene, polychloroprene, and olefin copolymers such as styrene-butadiene copolymers, nitrile rubbers (e.g., acrylonitrile-butadiene copolymer), polyvinyl chloride and nitrile rubber, ethylene-propylene copolymers, and butyl rubber (e.g., isobutylene-isoprene copolymer). The foam can be open-celled or closed-celled. Elastomers which are thermoplastic are also suitable as the compressible layer 70. The compressible layer 70 can be any thickness which can provide suitable cushioning of the substrate 12 against the pressured meyer rod 14. In general, the compressible layer 70 thickness is between about 0.125 and about 0.5 inch (about 0.3175 and about 1.27 cm) often about 0.25 inch (about 0.635 cm). Preferably, the compressible layer 70 is one layer but can be formed of more than one layer.

The compressibility of the compressible layer 70 is determined using a screw-driven universal test frame made by Instron, Model Number 1125, with a 50 pound load (22.7 kg) capacity cell, at a feed rate of 0.05 inch/min (0.122 cm/min), and with TestWorks for Windows software by MTS-Sintech. A test sample of 2 inch square, is placed on top of a flat steel platen and a 0.5 inch (1.27 cm) diameter rod is pressed into the sample across its full width. The load on the sample was from 0 to 10 pounds (0 to 4.54 kg) on the sample. If the test sample included a cover layer, the cover layer faced the rod. The compressibility of the substrate support can be between about 10 and about 165 pounds/inch-deflection/inch-length (about 0.7 to about 11.6 kg/cm-deflection/cm-length), and often between about 45 and 120 pound/inch-deflection/inch-length (about 3.2 to about 8.45 kg/cm-deflection/cm-length), and most often between about 45 and about 65 pounds/inch-deflection/inch-length (about 3.2 to about 4.58 kg/cm-deflection/cm-length).

In a first embodiment, the substrate support 22 is planar or sheet-like form of the compressible layer 70 having a first side 70a and a second side 70b opposite the first side 70a. The substrate 12 resides on the first side 70a of the compressible layer 70 during application of the solution. Preferably, the substrate support 22 can include at least one other layer in addition to the compressible layer 70 which does not interfere with the function of the compressible layer. The substrate support 22 can include a carrier layer 74 which is adjacent to the second side 70b of the compressible layer 70. The carrier layer 74 provides the compressible layer 70 with a rigidity or stiffness in-plane for ease in handling and transporting substrate support 22 through the nip area 30 into the drier area 20. Also, the durability of the system is improved since the carrier layer 74 protects the compressible layer 70 from rubbing by the substrate transport surface 18. The carrier layer 74 can be made of any material suitable to maintain the compressible layer 70 substantially stiff during handling and transporting, and includes metals; rigid synthetic resins, such as for example, acrylics, and polycarbonates; and polymeric films; such as for example polyester. Typical thickness for the carrier layer 74 is between about 0.005 and about 0.25 inch (about 0.0127 cm and about 0.635 cm). The carrier layer 74 can be adhered, in part or in-entirety, with a suitable adhesive to the compressible layer 70 to form a unitary structure. It is preferred that the carrier layer 74 and the compressible layer 70 are adhered together when the carrier layer 74 is a polymeric film.

The first side 70a of the compressible layer 70 can include a cover layer 78 of a polymeric film or fabric covering, such as for example, polyester, polyethylene, polyurethane, polypropylene, polystyrene, nylon, or fluoropolymer. The cover layer 78 stabilizes and protects the compressible layer 70 from contact with solutions and chemicals, as well as from retaining any permanent deformations from mishandling or the coating process. The cover layer 78 can also provide in-plane rigidity to the compressible layer to prevent stretching and/or buckling of the compressible layer during coating and handling. Depending upon the material chosen for the cover layer and the compressibility of the compressible layer, the cover layer 78 can have a thickness between about 0.005 and about 0.060 inch (about 0.0127 and about 0.1524 cm). It is preferred, but not necessary, that the cover layer 78 be adhered to the compressible layer 70 to form a unitary structure. It should be noted that as the carrier layer and/or the cover layer are added to the compressible layer of the substrate support, the compressibility of the substrate support will change. However, the compressibility or compression stiffness of the substrate support 22 often will remain in the range of between about 10 to about 165 pounds/in-deflection/inch-length (about 0.7 to about 11.6 kg/cm-deflection/cm-length).

A preferred embodiment of the substrate support 22 is a compressible layer 70 of open-celled natural foam rubber having as the cover layer 78, a synthetic fabric adhered to the first side, and, as a carrier layer 74, a polycarbonate sheet of 0.06 inch thick contacting the second side of the compressible layer 70. The compression stiffness of this embodiment of the substrate support is preferably from about 50 to about 60 pounds/inch-deflection/in-length. An alternate preferred embodiment is an open-celled polyurethane foam, PORON, types 4701-30, -40, -50 and -60, (available from Rogers Co., East Woodstock, Conn.) as a compressible layer 70. The compression stiffness of the compressible layer 70 as the substrate support 22 (without a cover layer 78 or carrier layer 74) is preferably between about 10 and about 120 pounds/in-deflection/inch-length (about 0.7 to about 8.45 kg/cm-deflection/cm-length). Also suitable as substrate support 22 is the same compressible layer 70 preferably having about a 0.007 to about 0.014 inch (about 0.178 to about 0.36 cm) thickness polyester film adhered as a cover layer 78 to the first side 70a and as a carrier layer 74 to the second side 70b of the compressible layer 70. The compression stiffness of this embodiment of the substrate support 22 is between about 35 and about 165 pounds/inch-deflection/inch-length (about 2.46 to about 11.6 kg/cm-deflection/cm-length).

Figure 5:
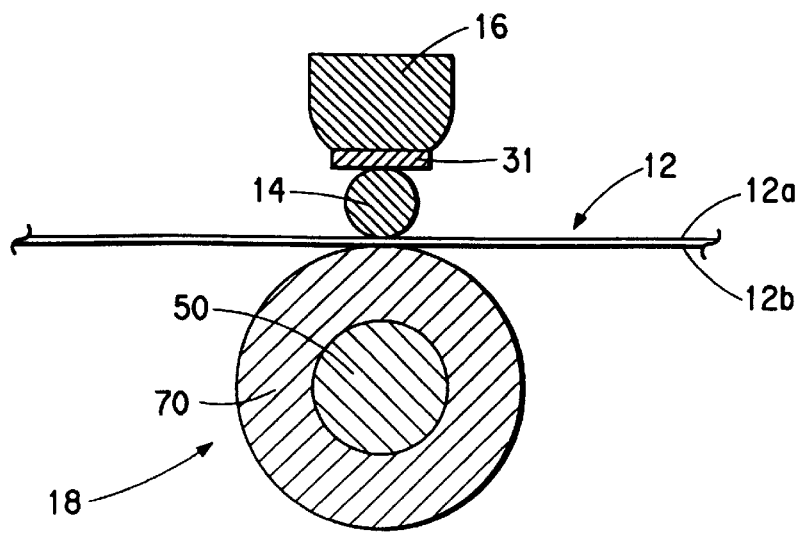
FIG. 5 is a schematic cross-sectional view of a second embodiment of the substrate support.

In a second embodiment shown in FIG. 5, the substrate transport surface 18 is formed from a compressible layer 70 so that the substrate transport surface 18 also performs the functions of the substrate support 22. In this embodiment, the compressible layer 70 surrounds and is integral with the drive roller 50. The compressible layer 70 on the roller 50 has a circumferential surface which can have additional compressible layers or a cover layer 78 as described above. For transport through the nip area 30, the second surface 12b of the substrate 12 is placed on the first side 70a of the compressible layer 70 of the substrate transport surface 18 and the first surface 12a of the substrate 12 contacts the meyer rod 14. Optionally, the substrate 12 can be placed on a sheet of polymeric film as is described above for the cover layer 78, which resides on the compressible layer 70. The sheet of polymeric film still permits the compressible layer 70 to function as a substrate support 22, but aids to transport the substrate 12 into the drier area 20 of the apparatus 10. Rollers suitable for use as the substrate support 22 and the substrate transport surface 18 are disclosed in U.S. Pat. No. 5,206,992 which is incorporated herein by reference. A preferred roller is sold by American Roller Co., as the Affinity type roller which is a closed-cell elastomeric layer having a polyurethane cover layer.

A variety of factors may affect the uniformity of a coating layer applied by the apparatus of the present invention. It has been found that major factors affecting the uniformity of the coating include the mass ($W_{bar}$) of the weight 16, the compression stiffness (K) of the substrate support 22, the weight ($W_{rod}$) of the meyer rod 14, the overall length ($L_{rod}$) of the meyer rod 14, the straightness or bow measurement (B) of the meyer rod 14, and the width (L) of the film feeding into the unit. In accordance with the present invention, it has been found that the apparatus of the present invention provides a substantially uniform coating layer when these major factors are coordinated to provide a uniform "Compliant Coating Number," (CCN) of greater than about 1.4, wherein CCN is expressed by equation (1) below:

$$CCN = \frac{(W_{bar} + W_{rod}) \times (L_{rod})^2}{K \times B \times (L)^3} \quad (1)$$

Preferably, CCN is greater than about 2.9. It is understood that other factors that may affect coating quality, including, for example, the diameter of the meyer rod, the rate at which the coating is applied, contaminants during the coating process, rheology properties of the coating solution; variability in the thickness and stiffness of the compliant coating pad; variability in the thickness and stiffness of the absorbent layer, alignment variability of the substrate with the coating equipment; and other dimensional variability in the components of the coating equipment such as, for example, drive rolls, weight bar or transport plate. Drying conditions such as temperature, residence time and heat transfer rate can also affect coating quality. Other factors affecting coating quality are described in "Coating and Drying Defects: Troubleshooting Operating Problems", Edgar B. Gutoff, Edward D. Cohen, John Wiley & Sons, Inc., 1995, the relevant portions of which are incorporated herein by reference.

Moreover, the uniformity and quality of the coating applied to the substrate is dependent upon the compressibility of the substrate support, the force applied by weight and the meyer rod and force applied to the meyer rod by the weight, as well as the type and/or condition of the meyer rod used. If any one of these factors is changed, such as the type of meyer rod used, one or more of the other factors may also need to change accordingly in order to provide the desired coating quality and uniformity.

The solutions which are applied to the substrate 12 by the present apparatus are not limited and can include nonphotosensitive as well as photosensitive solution, as well as aqueous or nonaqueous solution. One application of the present invention is to use photosensitive aqueous solutions having a colorant, i.e., pigment. Solutions identified as Waterproof™ Color Versatility Coating Ink, sold by DuPont (Wilmington, Del.), are particularly suitable. Preferably the solutions have a percentage of solids in solution is about 5.0 to about 14.3% by weight, and a viscosity between about 30 to about 650 centipoise (cps). The solution is dispensed manually by an operator from a squeeze bottle to the first surface 12a of the substrate 12 at the nip area 30 along the meyer rod 14.

Optionally, an absorbent layer (not shown) may be placed between the substrate 12 and the substrate support 22 for absorbing solution which flows over the periphery of the substrate 12. The dimensions of this absorbent layer is preferably greater than that of the substrate 12. Any material suitable to absorb the solution overflow is suitable, preferably the absorbent layer is paper.

In operation of the first embodiment depicted in FIGS. 2–4, the substrate 12 is placed on the first side 22a of the substrate support 22. The second surface 12b of the substrate 12 is adjacent to the first side 22a of the substrate support 22. Optionally an absorbent sheet is placed between the substrate 12 and the substrate support 22. A leading edge of the substrate support 22 is located at the nip area 30 above the substrate transport surface 18. The leading edges of the substrate 12 and absorbent sheet may be taped to the substrate support 22. The ends 24 of the meyer rod 14 are positioned in the rod keeper 26, and thus the substrate 12 and substrate support surface 22 (and optional absorbent sheet) are captured in the nip area 30 between the meyer rod 14 and the substrate transport surface 18. The solution is manually applied onto the first surface 12a of the substrate 12 by an operator from a squeeze bottle at the nip area 30 along the meyer rod 14. The weight assembly 32 is moved from the first position to the second position. The ends 35a of the handle 35 are moved past the movable retaining pin 45 and the arm members 34 are rotated about pivot shaft 33 so that the weight 16 resides on the meyer rod 14. The motor 55 to the drive roller 50 of the substrate transport surface 18 is turned on, and the substrate support is directed into a drier area 20 that may be preheated. The drive roller 50 rotates to transport the substrate support 22 carrying the substrate 12 through the nip area 30, thereby metering the solution as a layer onto the substrate 12. The meyer rod 14 is prevented from rotation during application by the contact of the pin 28 in the rod keeper 26. The coated substrate 12 on the substrate support 22 enters the drier area 20 where the excess moisture from the layer is removed to dry. The substrate 12 on the substrate support 22 is conveyed through the drier area 20 to an exit by the driven conveyor 62.

The present apparatus and process for applying a substantially uniform coating of solution onto a substrate provides for equivalent coating quality of mass production web coating equipment in a simple, easy-to-use, table-top sheet coating apparatus. The apparatus provides users with ability to make custom color coatings which is useful in making pre-press proof with the custom color. Substantially uniform coating thickness can be determined by measurement of the coating thickness at various locations on the substrate or can be determined optically by measurement of color density at various locations on the substrate. Uniform coating thickness will represent minimal color density variation in a pre-press color proof.

The present apparatus applies a coating of a color solution as a layer onto a substrate to form a photosensitive element for use in a method for making a pre-press proof as disclosed in U.S. Pat. No. 5,075,722 which is hereby incorporated by reference. After forming the custom color photosensitive element, the photosensitive element is imagewise exposed to actinic radiation with a transparency representative of the custom color and the soluble areas of the element are washed out in a suitable processing apparatus such as disclosed in U.S. Pat. No. 5,059,996 which is incorporated herein by reference. The imaged element is then laminated-in-register to at least a support or receptor for multicolor proof images in a suitable laminating apparatus such as disclosed in U.S. Pat. Nos. 5,236,542 and 5,476,568 both of which are incorporated herein by reference. The support or receptor may have one or more colored images previously built upon itself.

It is understood that the present invention is useful for all types of coating rods, including, for example, wire-wound meyer rods and contoured meyer rods.

The following example is illustrative of the invention, but not intended to be limiting.

EXAMPLE

An apparatus as illustrated in FIGS. 1–4 was used to coat a layer on a substrate 12 available from E.I. du Pont de Nemours and Company (Wilmington, Del.) having a thickness of 4 mil (100 μm). The solution applied to the substrate 12 was a pigment solution identified as WaterProof™ Color Versatility Coating Ink, available from E.I. du Pont de Nemours and Company (Wilmington, Del.). This pigment solution has about 10 weight percent solid and a viscosity of between 350 and 500 cps measured by test method ASTM D-2196 (1986) ("Standard Test Methods for Rheological Properties of Non-Newtonian Materials by Rotational (Brookfield) Viscometer"). Each coating layer produced generally had wet coating thickness of about 0.0011 inch (0.0028 cm), with a drying coating thickness of about 0.00011 inch (0.00028 cm).

The meyer rod 14 used was a #11 wire-wound meyer rod available from RDS of Webster, N.Y. Table I below lists the dimensions of the meyer rod.

TABLE I

| Component | Dimension | Measurement |
|---|---|---|
| meyer rod 14 | overall length ($L_{rod}$) | 30.5 inch (77.47 cm) |
| | total rod weight ($W_{rod}$) | 2.7 lb (1226 g) |
| | total diameter (including wrapped wires) | 0.647 inch (1.643 cm) – 0.625 inch (1.588 cm) bar with 0.011 inch (0.0279 cm) wire |
| substrate 12 | width (L), which is the width of the desired coating layer | 25 inch (63.5 cm) |

Coating layers were produced by using various types of substrate support 22 and weight 16 during the coating process and using meyer rods having varying degrees of bow. Each coating layer therefore had a set of varied process parameters (B, $W_{bar}$ and K) as listed in Table II below. The bow measurement procedure is described below.

The material used for the substrate support 22, the cover layer 78 and carrier layer 74 for each compressibility (K) value in Table III are listed in Table II below.

TABLE II

| K | Compressible Layer 7 | Cover Layer 78 | Carrier Layer 74 |
|---|---|---|---|
| 13 | 0.25-inch Poron 4701-30 | None | 0.06-inch Polycarbonate |
| 35 | 0.25-inch Poron 4701-30 | 0.0075-inch Mylar (polyethylene terephthalate) | 0.014-inch Mylar |
| 56 | 0.25-inch Neoprene Foam Rubber Open cell sponge | Fabric about 0.01" | 0.06-inch Polycarbonate |

TABLE II-continued

| K | Compressible Layer 7 | Cover Layer 78 | Carrier Layer 74 |
|---|---|---|---|
| | rubber pad, Part 2FSO with polyester fabric on one side (available from Aero Rubber of Bridgeview, IL) | | |
| 6 | 0.25-inch Poron 4701-40 | 0.0075-inch Mylar | 0.014-inch Mylar |
| 118 | 0.25-inch Poron 4701-40 | 0.014-inch Mylar | 0.0075-inch Mylar |

Each weight 16 used included a cushion 31 made of 0.0625-inch silicon rubber (60 durometer) which contacts the meyer rod 14 and prevents damage occurring to the meyer rod 14 from contact with the weight 16. The drive roller 50 had a covering of hardened rubber, such as for example, EPDM (durometer of 60 Shore A), which provided a high frictional surface to the substrate transport surface 18 for the substrate support 22. The device included a conveyor 62 for holding the substrate 12 and substrate support as well as a heating lamp for removing excess moisture or volatile components from the coated layer on the substrate 12. The air temperature and the temperature of the coating layer on the substrate in the drier area 20 were within the range of about 35 to about 50° C. The drier area 20 was about 12 inch (50 cm) long;

residence time was 30 sec.

Bow Measurement Procedure:

The Meyer rods were evaluated for TIR (Total Indicator Runout) using the following test procedure. The rod was supported on each end (¼"–½" engagement no wire in this region) in V-blocks (making sure there was no burrs on the rod's or V-block's surface). A dial indictor with 0.0005" resolution and a ⅛" diam hemi-spherical tip was placed on the top side of the rod in the center (equally spaced between the V-blocks). The rod was rotated by hand through one complete revolution and the difference between the maximum and minimum reading on the dial indictor was recorded as the rod's TIR.

Bow measurement of a meyer rod was calculated by using formula (2) below:

$$BOW(B) = \frac{TIR}{2} \quad (2)$$

The density variability of each coating layer of a set of varied process parameters were measured using the density procedure described below.

Density Variability Measurement

In the procedure described below, a Macbeth RD918-SB densitometer available from Macbeth, New Windsor, N.Y.) was used.

1. Place white receptor paper (LustroGloss available from S.D. Warren Company of Boston, Mass.) under coating to be measured;
2. Set desitometoer to "Null Density";
3. Select the proper color filter;
4. Position the densitometer on an uncoated region of the receptor over the paper and zero it;
5. Position the coating to read approximately ⅓ of the way from the top of the coating layer;
6. Starting from one edge about 0.5 inch in from the coating start, take a density reading (Dmax) every inch;

7. Position the coating to read approximately ⅔ of the way from the top of the coating layer;

8. Repeat step 6;

9. Calculate the average value ("Dmax[average]) and standard deviation of the Dmax. The standard deviation of Dmax is the density uniformity value.

Table III shows for each sample, the measured density uniformity and observed density defects as well as CCN calculated using the previously described formula (1).

TABLE III

| Sample | Weight Bar ($W_{bar}$) [lb] | Pad Stiff (K) [lb/inch/inch] | Bow (B) [inch] | CCN | Density Uniformity | High Density Defects* |
|---|---|---|---|---|---|---|
| 1 | 7.5 | 118 | 0.0125 | 0.41 | 0.078 | MD Lane |
| 2 | 10 | 118 | 0.0125 | 0.51 | 0.021 | MD Lane |
| 3 | 7.5 | 67 | 0.0125 | 0.73 | 0.069 | MD Lane |
| 4 | 7.5 | 118 | 0.006 | 0.86 | 0.059 | MD Lane |
| 5 | 7.5 | 56 | 0.0125 | 0.87 | 0.055 | MD Lane |
| 6 | 10 | 67 | 0.0125 | 0.90 | 0.017 | Spot |
| 7 | 10 | 118 | 0.006 | 1.07 | 0.015 | Spot |
| 8 | 10 | 56 | 0.0125 | 1.08 | 0.034 | Spot |
| 9 | 7.5 | 35 | 0.0125 | 1.39 | 0.025 | |
| 10 | 7.5 | 67 | 0.006 | 1.51 | 0.025 | MD Lane |
| 11 | 7.5 | 35 | 0.0125 | 1.73 | 0.016 | |
| 12 | 7.5 | 56 | 0.006 | 1.81 | 0.027 | Spot |
| 13 | 10 | 67 | 0.006 | 1.88 | 0.019 | |
| 14 | 7.5 | 118 | 0.0025 | 2.06 | 0.030 | MD Lane |
| 15 | 10 | 56 | 0.006 | 2.25 | 0.028 | |
| 16 | 10 | 118 | 0.0025 | 2.56 | 0.023 | Spot |
| 17 | 7.5 | 35 | 0.006 | 2.89 | 0.020 | |
| 18 | 10 | 35 | 0.006 | 3.60 | 0.018 | |
| 19 | 7.5 | 67 | 0.025 | 3.63 | 0.025 | |
| 20 | 7.5 | 13 | 0.0125 | 3.74 | 0.031 | |
| 21 | 7.5 | 56 | 0.0025 | 4.34 | 0.026 | |
| 22 | 10 | 67 | 0.0025 | 4.51 | 0.021 | |
| 23 | 10 | 13 | 0.0125 | 4.65 | 0.025 | |
| 24 | 10 | 56 | 0.0025 | 5.40 | 0.026 | |
| 25 | 7.5 | 35 | 0.0025 | 6.94 | 0.016 | |
| 26 | 7.5 | 13 | 0.006 | 7.79 | 0.018 | |
| 27 | 10 | 35 | 0.0025 | 8.64 | 0.018 | |
| 28 | 10 | 13 | 0.006 | 9.69 | 0.021 | |
| 29 | 7.5 | 13 | 0.0025 | 18.69 | 0.026 | |
| 30 | 10 | 13 | 0.0025 | 23.26 | 0.028 | |

*Definition of:
"High Density Defect": a defect having a Dmax[defect] value such that 0.]<Dmax[defect]–Dmax[average], as opposed to a "low density defect," which has a Dmax[defect] value such that –0.1>Dmax[defect]–Dmax[average]. "Low density defect" is often due to factors other than equipment component properties.
"MD Lane": a machine-direction strip having a width of greater than about 0.06-inch, and having a Dmax[defect] value such that 0.1<Dmax[defect]–Dmax[average].
"Spot": a localized defect having a diameter of greater than about 0.5-inch and having a Dmax[defect] value such that 0.1<Dmax[defect]–Dmax[average].

Acceptable coating performance for proofing purposes is defined by no observed high or low density defects and a density variability of less than about 0.030.

Of course, it should be understood that a wide range of changes and modifications can be made to the preferred embodiment described above. It therefore is intended that the foregoing detailed description be regarded as illustrative rather than limiting and that it be understood that it is the following claims, including all equivalents, which are intended to define the scope of this invention.

What is claimed is:

1. A process for applying a substantially uniform coating of solution onto a substrate having a first substrate surface and a second substrate surface, the process comprising:

providing a substrate support for the substrate, the substrate support including a compressible layer having a compressible stiffness (K);

forming a substrate composite including the substrate and the substrate support, wherein the second substrate surface is adjacent to the substrate support;

forming a nip area between a meyer rod and a substrate transport surface, the meyer rod having an overall length ($L_{rod}$), a total rod weight value ($W_{rod}$), and a bow measurement (B);

applying a substantially uniform force onto the meyer rod;

providing a coating solution on at least a portion of the first substrate surface at the nip area;

feeding the substrate composite through the nip area, the meyer rod thereby metering the coating solution over substantially the entire first substrate surface, thereby forming a layer of solution coating, the layer having a width value (L);

drying a layer of solution coating in a drying area, whereby a photosensitive element is formed;

wherein the compressible layer maintains substantially uniform contact between the substrate and the meyer rod to provide a substantially uniform coating of the coating solution.

2. The process of claim 1 wherein the substrate support has a compression stiffness between about 0.7 to about 11.6 kg/cm-deflection/cm-length.

3. The process of claim 1 further comprising:

exposing imagewise the photosensitive element to actinic radiation to form soluble areas and insoluble areas on the element;

treating the exposed element to remove the soluble areas; and laminating the treated element to a receptor.

4. The process of claim 1 wherein the substantially uniform force is applied using a weight place on top of the meyer rod.

5. The process of claim 1 or 4 wherein the substantially uniform force includes a magnetic force.

6. The process of claim 1, 4 or 5 wherein the substantially uniform force is applied using mechanical springs, electro-mechanical components or pneumatic components.

7. The process of claim 1 wherein the substantially uniform force is applied using a weight having a total weight value ($W_{bar}$), such that the meyer rod, compressible layer weight satisfy a CCN of greater than about 1.4, the CCN being defined by formula (1):

$$CCN = \frac{(W_{bar} + W_{rod}) \times (L_{rod})^2}{K \times B \times (L)^3} \quad (1)$$

8. The process of claim 7, wherein the CCN is greater than about 2.9.

9. The process of claim 1, wherein the coating solution is intermittently applied on at least a portion of the first substrate surface at the nip area.

10. The process of claim 1, wherein the coating solution is continuously applied on at least a portion of the first substrate surface at the nip area.

* * * * *